(12) United States Patent
Nakashiba (10) Patent No.: US 11,393,782 B2
(45) Date of Patent: *Jul. 19, 2022

(54) SEMICONDUCTOR DEVICE HAVING AN INDUCTOR

(71) Applicant: Renesas Electronics Corporation, Tokyo (JP)

(72) Inventor: Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 155 days.

This patent is subject to a terminal disclaimer.

(21) Appl. No.: 15/643,906

(22) Filed: Jul. 7, 2017

(65) Prior Publication Data

US 2017/0309587 A1 Oct. 26, 2017

Related U.S. Application Data

(63) Continuation of application No. 14/483,300, filed on Sep. 11, 2014, now Pat. No. 9,721,917, which is a
(Continued)

(30) Foreign Application Priority Data

| Jul. 3, 2006 | (JP) | JP2006-183569 |
| Jan. 22, 2007 | (JP) | JP2007-011995 |
| Jun. 18, 2007 | (JP) | JP2007-159764 |

(51) Int. Cl.
*H01L 23/00* (2006.01)
*H01L 23/498* (2006.01)
*H01L 23/522* (2006.01)

(52) U.S. Cl.
CPC ........ *H01L 24/17* (2013.01); *H01L 23/49838* (2013.01); *H01L 23/5227* (2013.01);
(Continued)

(58) Field of Classification Search
CPC .......... H01L 23/49838; H01L 23/5227; H01L 24/17; H01L 2224/0554; H01L 2224/0555;
(Continued)

(56) References Cited

U.S. PATENT DOCUMENTS

| 5,825,092 A | 10/1998 | Delgado et al. |
| 6,180,445 B1 * | 1/2001 | Tsai .................... H01L 23/5329 438/238 |

(Continued)

FOREIGN PATENT DOCUMENTS

| CN | 1170961 | 1/1998 |
| CN | 1141738 | 3/2004 |

(Continued)

OTHER PUBLICATIONS

Hajimiri et al., "Design Issues in CMOS Differential LC Oscillators,", IEEE J. of Solid-State Cir., vol. 34, No. 5, pp. 717-724 (May 1999).
(Continued)

*Primary Examiner* — Vongsavanh Sengdara
(74) *Attorney, Agent, or Firm* — Nixon & Vanderhye (57) ABSTRACT

A semiconductor device is provided with a semiconductor chip. The semiconductor chip has a semiconductor substrate, an interconnect layer, an inductor and conductive pads (first pads). The interconnect layer is provided on the semiconductor substrate. The interconnect layer includes the inductor. The pads are provided on the interconnect layer. The pads are provided in a region within a circuit forming region of the semiconductor chip, which does not overlap the inductor.

24 Claims, 10 Drawing Sheets

Related U.S. Application Data continuation of application No. 11/822,064, filed on Jul. 2, 2007, now Pat. No. 8,860,178.

(52) U.S. Cl.
CPC ........... *H01L 2224/0554* (2013.01); *H01L 2224/05568* (2013.01); *H01L 2224/05573* (2013.01); *H01L 2224/13099* (2013.01); *H01L 2224/16* (2013.01); *H01L 2224/16225* (2013.01); *H01L 2224/16227* (2013.01); *H01L 2224/1713* (2013.01); *H01L 2224/81385* (2013.01); *H01L 2924/00014* (2013.01); *H01L 2924/014* (2013.01); *H01L 2924/01013* (2013.01); *H01L 2924/01033* (2013.01); *H01L 2924/01079* (2013.01); *H01L 2924/10253* (2013.01); *H01L 2924/13091* (2013.01); *H01L 2924/14* (2013.01); *H01L 2924/1423* (2013.01); *H01L 2924/19041* (2013.01); *H01L 2924/19042* (2013.01); *H01L 2924/19043* (2013.01)

(58) Field of Classification Search
CPC ... H01L 2224/0556; H01L 2224/05568; H01L 2224/05573; H01L 2224/05599; H01L 2224/0615; H01L 2224/1309; H01L 2224/16; H01L 2224/16225; H01L 2224/16227; H01L 2224/1713; H01L 2224/81385; H01L 2924/00; H01L 2924/00014; H01L 2924/01033; H01L 2924/01079; H01L 2924/014; H01L 2924/10253; H01L 2924/13091; H01L 2924/14; H01L 2924/1423; H01L 2924/19041; H01L 2924/19042; H01L 2924/19043
See application file for complete search history.

(56) References Cited

U.S. PATENT DOCUMENTS

| | | | |
|---|---|---|---|
| 6,423,576 B1 | 7/2002 | Hoffman | |
| 6,630,725 B1 | 10/2003 | Kuo et al. | |
| 6,638,844 B1 * | 10/2003 | Verma | H01L 27/0617 438/668 |
| 6,852,616 B2 | 2/2005 | Sahara et al. | |
| 2001/0031548 A1 | 10/2001 | Elenius et al. | |
| 2002/0064923 A1 * | 5/2002 | Yamauchi | H01L 28/10 257/E21.022 |
| 2002/0151104 A1 | 10/2002 | Sahara | |
| 2003/0009863 A1 | 1/2003 | Figueredo et al. | |
| 2003/0127704 A1 | 7/2003 | Kobayashi et al. | |
| 2005/0030098 A1 | 2/2005 | Aoki et al. | |
| 2005/0199979 A1 | 9/2005 | Shimoishizaka et al. | |
| 2006/0030115 A1 | 2/2006 | Chung | |
| 2006/0157798 A1 * | 7/2006 | Hayashi | H01L 27/0617 257/E29.022 |
| 2006/0170072 A1 | 8/2006 | Nakashiba | |
| 2006/0263727 A1 * | 11/2006 | Lee | H01L 24/10 430/394 |
| 2007/0023862 A1 | 2/2007 | Takagi | |
| 2007/0138594 A1 * | 6/2007 | Lee | H03H 9/105 257/531 |
| 2008/0265367 A1 * | 10/2008 | Tan | H01L 24/81 257/531 |
| 2009/0152674 A1 * | 6/2009 | Uchida | H01L 29/0619 257/531 |

FOREIGN PATENT DOCUMENTS

| | | |
|---|---|---|
| JP | 2000-294733 | 10/2000 |
| JP | 2003-45989 | 2/2003 |
| JP | 2004-320047 | 11/2004 |
| JP | 2005-340731 | 12/2005 |
| JP | 2006-059955 | 3/2006 |

OTHER PUBLICATIONS

Chinese Patent Office issued a Chinese Office Action dated Jul. 17, 2009, Application No. 2007101278067.
Chinese Office Action dated Feb. 9, 2012, with English Translation.
Japanese Official Action—2007-159764—dated Aug. 21, 2012.
Japanese Official Action—2007-159764—dated Nov. 27, 2012.
JP Office Action dated Sep. 24, 2013, with English translation; Application No. 2007-159764.
Chinese Office Action, dated Aug. 25, 2014, in corresponding Chinese Patent Application No. 201210407537.0.
Chinese Official Action—201210407537.0—dated Apr. 22, 2015.

* cited by examiner

FIG. 10B

SEMICONDUCTOR DEVICE HAVING AN INDUCTOR

This application is based on Japanese Patent application Nos. 2006-183569 and 2007-011995 and 2007-159764, the contents of which are incorporated hereinto by reference.

BACKGROUND

Technical Field

The present invention relates to a semiconductor device having an inductor.

Related Art

In some cases, an inductor is provided in conventional matching circuits for MMIC's (monolithic microwave integrated circuit) and the like (for example Japanese Unexamined Patent Publication No. 2002-289782). In addition, in recent years, a voltage control oscillator using the resonation phenomenon of a parallel LC tank circuit is sometimes used as a local oscillator of a PLL (phase locked loop) circuit. An inductor is naturally provided to such a voltage control oscillator (for example, Ali Hajimiri et al., "Design Issues in CMOS Differential LC Oscillators," IEEE JOURNAL OF SOLID-STATE CIRCUITS, Vol. 34, No. 5, May 1999, pp. 717-724).

Figure 7:
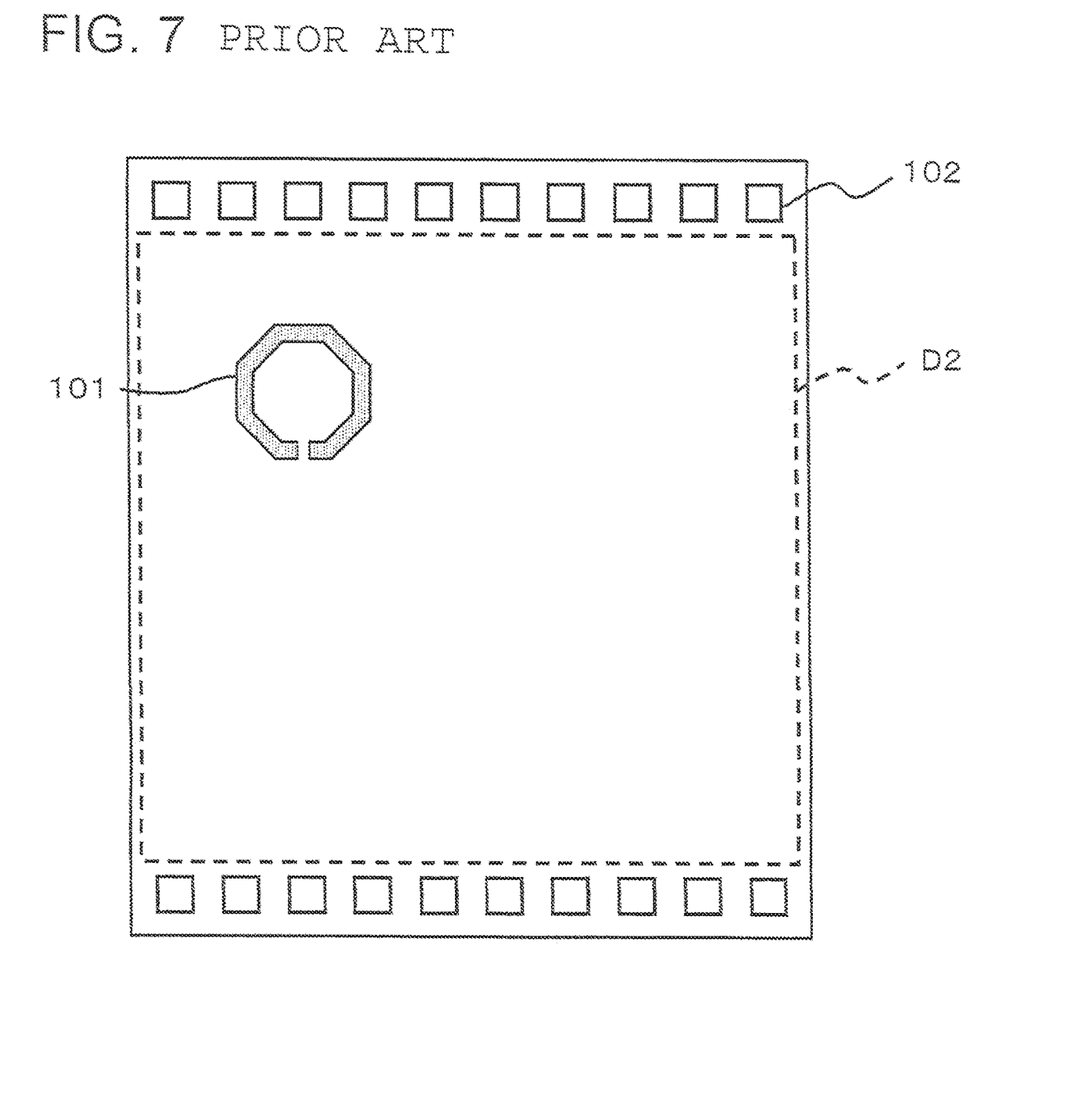
FIG. 7 is a plan view showing an example of a semiconductor device according to a conventional art.

FIG. 7 is a plan view schematically showing the MMIC disclosed in Japanese Unexamined Patent Publication No 2002-289782. An inductor 101, which forms a matching circuit, is formed in this MMIC. In addition, pads 102, which bumps for flip-chip mounting of the MMIC on a substrate are connected, are formed. The pads 102 are arranged outside the circuit forming region D2 in this MMIC.

The present inventor has recognized as follows. A circuit scale of the MMIC in FIG. 7 is not great, and therefore, the pads 102 can be arranged outside the circuit forming region D2. When the circuit scale becomes great, such as an LSI, however, the number of pads 102 increases, and therefore, the chip size increases, in the case where the pads are arranged outside the circuit forming region D2.

Figure 8:
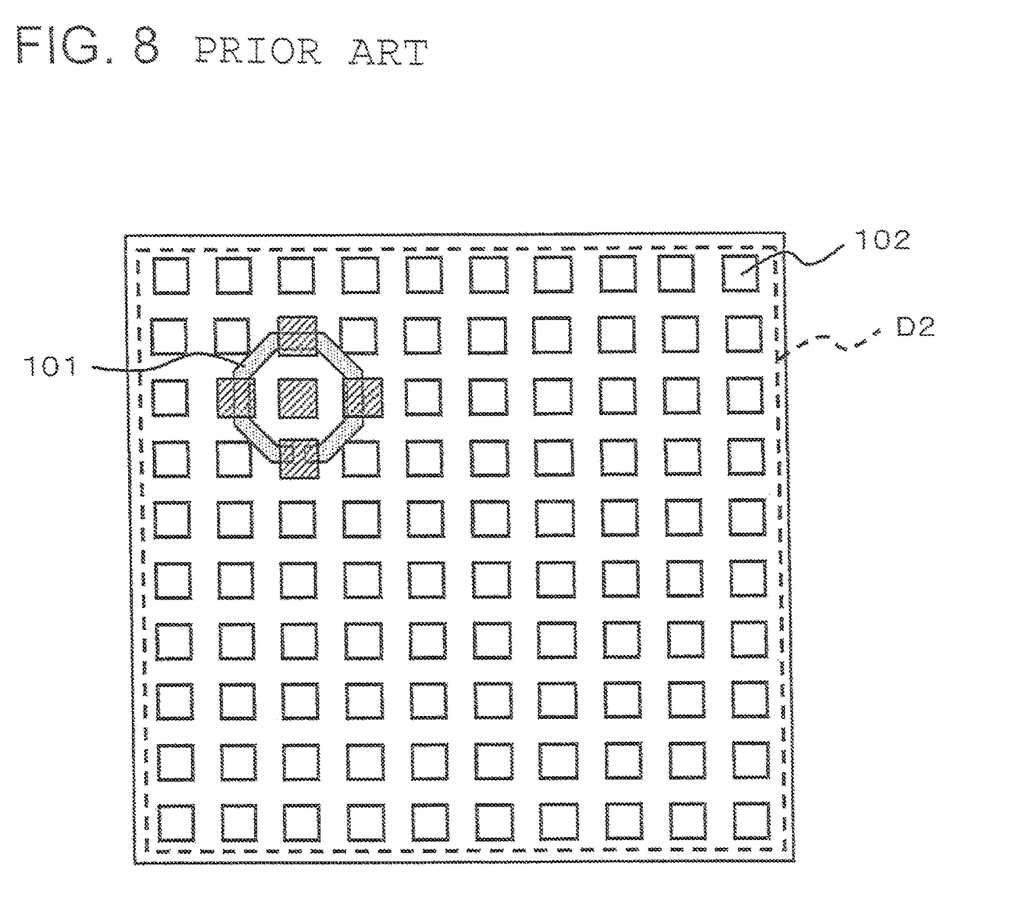
FIG. 8 is a plan view showing another example of a semiconductor device according to a conventional art.

Thus, as shown in FIG. 8, it is considered to arrange pads 102 within the circuit forming region D2. As a result, a great number of pa's 102 can be provided without increasing the chip size.

In FIG. 8, however, the magnetic field of an inductor 101 generates an eddy current in pads 102 located above the inductor (hatched portions). Then, this eddy current generates a magnetic field of a polarity so as to cancel the above described magnetic field following Lenz's law, and thus, the strength of the magnetic field lowers. Lowering of the strength of the magnetic field leads to lowering of the Q value.

SUMMARY

According to the present invention, there is provided a semiconductor device comprising a semiconductor chip having: a semiconductor substrate; an interconnect layer including an inductor provided on the above described semiconductor substrate; and first conductive pads provided on the above described interconnect layer, wherein a circuit forming region is provided right under the above described first pads, and the above described first pads, and the first pads are provided in a region, which does not overlap the above described inductor in a plan view.

In this semiconductor device, a circuit forming region is provided right under pads. As a result, a sufficient number of pads can be provided without increasing the chip size. In addition, the pads are arranged shunning the portion above the inductor. As a result, the magnetic field of the inductor can be prevented from generating an eddy current in the pads.

According to the present invention, a semiconductor device where it is possible to prevent an eddy current from being generated in the pads while preventing increase in the chip size can be implemented.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the following, a preferred embodiments of the semiconductor device according to the present invention are described in detail in reference to the drawings. Here, the same symbols are attached to elements which are the same in the drawings, and descriptions for the same elements are not repeated.

First Embodiment

Figure 1:
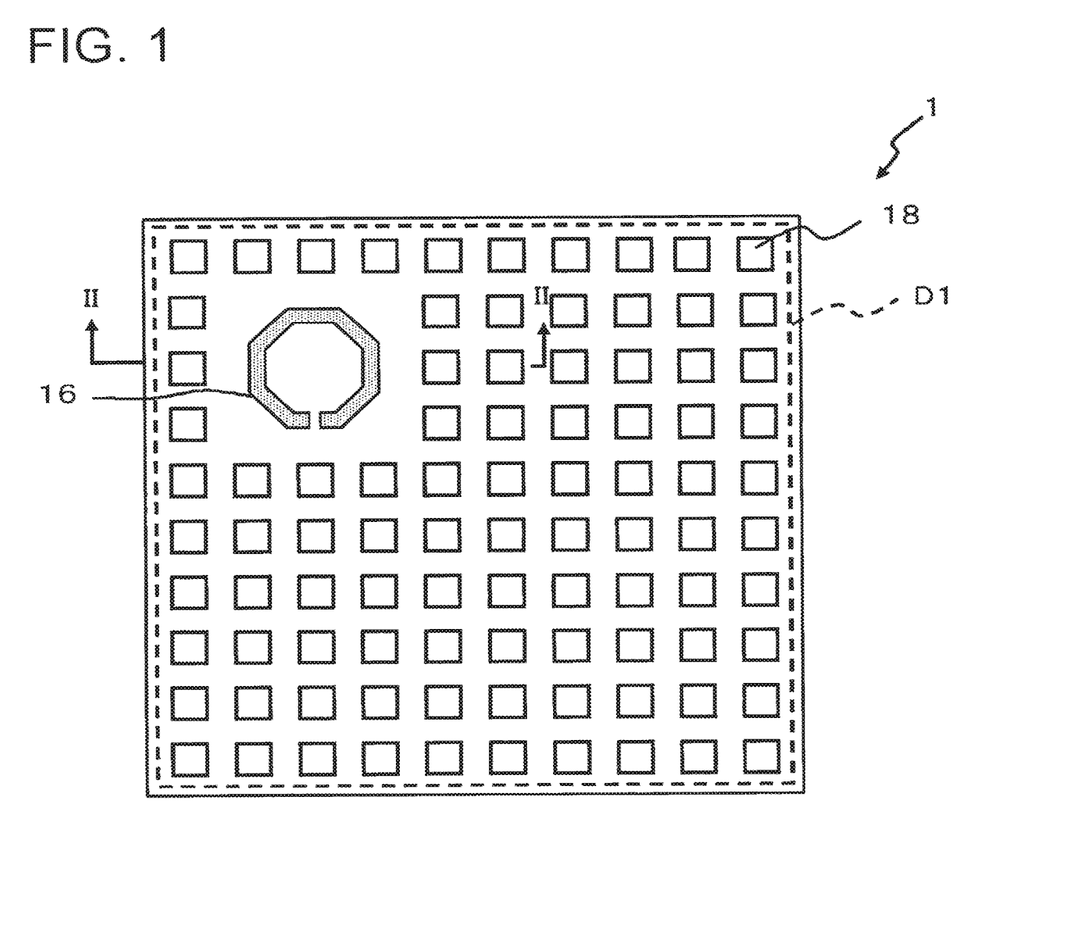
FIG. 1 is a plan view showing a semiconductor device according to a first embodiment of the present invention.
Figure 2:
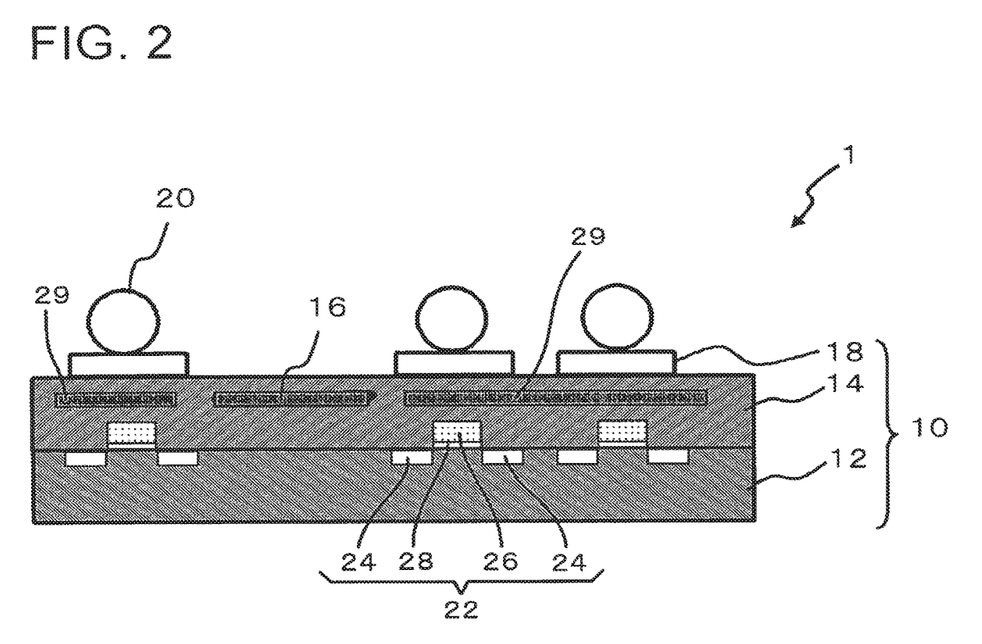
FIG. 2 is a cross sectional view along line II-II showing the semiconductor device of FIG. 1.

FIG. 1 is a plan view showing a semiconductor device according to a first embodiment of the present invention. FIG. 2 is a cross sectional view along line II-II showing the semiconductor device of FIG. 1. The semiconductor device 1 is provided with a semiconductor chip 10. The semiconductor chip 10 has a semiconductor substrate 12, an interconnect layer 14, an inductor 16 and conductive pads (first pads). The semiconductor substrate 12 is, for example, a silicon substrate.

The interconnect layer 14 is provided on the semiconductor substrate 12. The interconnect layer 14 includes the inductor 16 and interconnects 29. The inductor 16 is formed of an interconnect in coil form in the interconnect layer 14.

The pads 18 are provided on the interconnect layer 14. The pads 18 are provided in a circuit forming region D1 of the semiconductor chip 10. That is to say, a circuit forming region is provided directly under the pads 18. The circuit forming region is a region where circuit elements and interconnects are formed. The circuit elements referred to herein include active elements, such as transistors, and passive elements, such as resistors, capacitors and inductors, and do not include interconnects. In FIG. 2, for example, a MOS transistor 22, which is made of a gate electrode 26; a gate insulating film 28; and source/drain regions 24, and an interconnect 29 are formed directly under the pads 18. Here, the circuit forming region may be a region where at least one of a circuit element and an interconnect is formed. The pads 18 are provided in a region, which does not overlap the inductor 16 of the semiconductor chip 10 in a plan view. That is to say, there are no pads 18 above the inductor 16.

As can be seen from FIG. 1, the pads 18 are aligned regularly (in a square pattern according to the present embodiment) in a region other than the region which overlaps the inductor 16 in a plan view. The arrangement of the pads 18 in FIG. 1 corresponds to an arrangement obtained by removing nine pads 102, including the five pads 102 which are hatched in the above described FIG. 8, and the four pads 102 in the vicinity of these.

The bumps 20 are provided on the pads 18 of the semiconductor chip 10. The bumps 20 are also provided in a region which does not overlap the inductor 16 in a plan view, as are the pads 18. The bumps 20 are, for example, solder bumps or gold bumps. The bumps 20 function as external electrode terminals for the semiconductor device 1. When the semiconductor device 1 is mounted on a substrate, such as an interconnect substrate, the semiconductor device 1 and the substrate are connected to each other via these bumps 20. Here, the humps 20 are not shown in the plan view of FIG. 1.

The effects of the present embodiment are described below. In the semiconductor device 1, the circuit forming region is provided directly under the pads 18. As a result, a sufficient number of pads 18 can be provided without increasing the chip size. In addition, the pads 18 are placed shunning the portion above the inductor 16. As a result, the magnetic field of the inductor 16 can be prevented from generating an eddy current in the pads 18. Therefore, a semiconductor device 1, where it is possible to prevent an eddy current from being generated in the pads 18 while preventing increase in the chip size, can be implemented.

Furthermore, the bumps 20 are also provided in a region which does not overlap the inductor 16 in a plan view. As a result, the magnetic field of the inductor 16 can also be prevented from generating an eddy current in the bumps 20. If an eddy current is generated in the bumps 20, the strength of the magnetic field in the inductor lowers, as in the case where an eddy current is generated in the pads 18.

The pads 18 are aligned in a square pattern in regions other than the region, which overlaps the inductor 16 in a plan view. As a result, a great number of pads 18 can be provided. Here, the pads 18 may be aligned in a diagonal grid pattern instead of in a square pattern.

The inductor 16 is formed of an interconnect in coil form in the interconnect layer 14. As a result, the inductor 16 can be easily provided in the semiconductor chip 10.

According to the present embodiment, all of the pads 18 are in the circuit forming region D1, and therefore, the chip size can be kept particularly small.

Second Embodiment

Figure 3A:
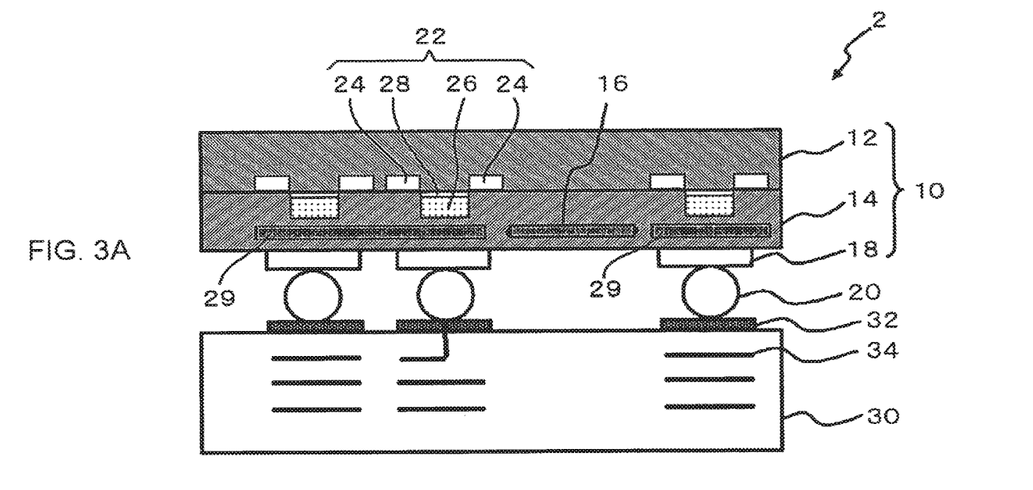
FIGS. 3A and 3B are cross sectional views showing semiconductor devices according to a second embodiment of the present invention.

FIG. 3A is a cross sectional view showing the semiconductor device according to a second embodiment of the present invention. A semiconductor device 2 is provided with a semiconductor chip 10 and a mounting substrate 30. The configuration of the semiconductor chip 10 is the same as described in the first embodiment. The mounting substrate 30 has conductive pads 32 (second pads) provided on the upper surface thereof. The semiconductor chip 10 is flip-chip mounted on the mounting substrate 30 by connecting the bumps 20 to the pads 32. The mounting substrate 30 is, for example, a printed interconnect substrate or a silicon interposer. In addition, the mounting substrate 30 may be a semiconductor chip different from the semiconductor chip 10.

The pads 32 are also provided in a region, which does not overlap the inductor 16 in a plan view, of the semiconductor chip 10 as are the pads 18 and the bumps 20. Furthermore, interconnects 34 provided inside the mounting substrate 30 are also provided in a region, which does not overlap the inductor 16 in a plan view, of the semiconductor chip 10. The interconnects 34 are electrically connected to the pads 32.

According to the present embodiment, the pads 32 and the interconnects 34 are provided in a region, which does not overlap the inductor 16 in a plan view. As a result, the magnetic field of the inductor 16 can be prevented from generating an eddy current in the pads 32 and the interconnects 34. If an eddy current is generated in the pads 32 or the interconnects 34, the strength of the magnetic field of the inductor lowers, as in the case where an eddy current is generated in the pads 18. Other effects of the present embodiment are the same as in the first embodiment.

Figure 3B:
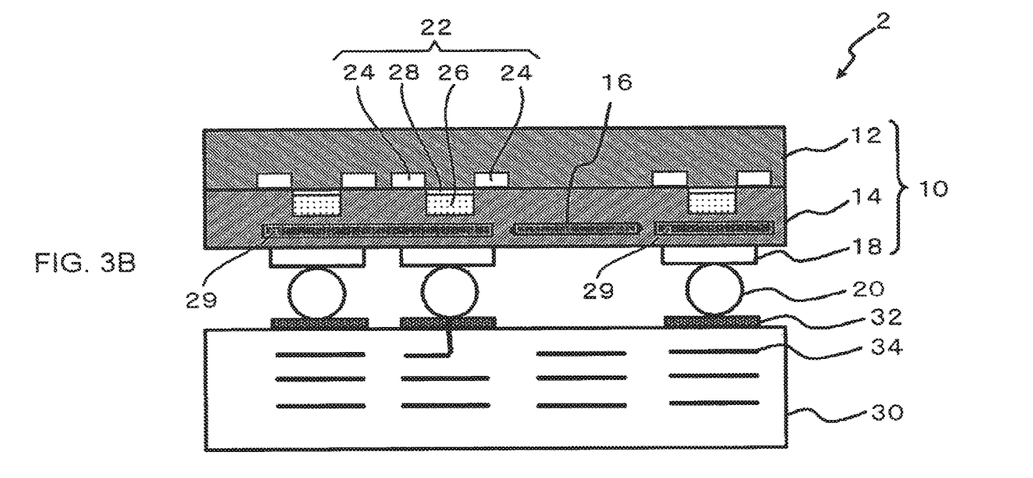

Here, according to the present embodiment, only either of the pads 32 and the interconnects 34 may be placed shunning the portion under the inductor 16. FIG. 3B shows an example of the case where only the pads 32 are placed shunning the portion under the inductor 16. In this case also, reduction in the strength of the magnetic field can be kept small in comparison with the case where both of the pads 32 and the interconnects 34 are placed under the inductor 16.

Third Embodiment

Figure 9A:
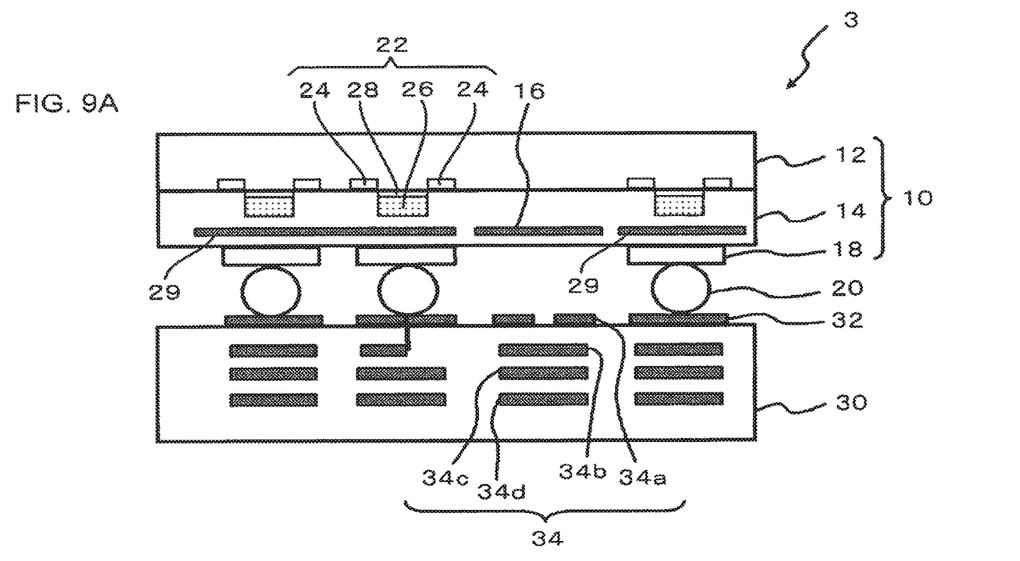
FIGS. 9A and 9B are cross sectional views showing semiconductor devices according to a third embodiment of the present invention.

FIG. 9A is a cross sectional view showing the semiconductor device according to the third embodiment of the present invention. A semiconductor device 3 is provided with a semiconductor chip 10 and a mounting substrate 30. The configuration of the semiconductor chip 10 is the same as described in the first embodiment. Interconnects 34 in the mounting substrate 30 have a multilayered interconnect structure made up of interconnects 34a (first interconnects), interconnects 34b (second interconnects), interconnects 34c (third interconnects) and interconnects 34d (fourth interconnects). The interconnects 34a are interconnects in the top layer and provided in the same layer as pads 32. The interconnects 34b are located one layer under the interconnects 34a. Likewise, the interconnects 34c and the interconnects 34d are located one layer under the interconnects 34b and the interconnects 34c, respectively.

In the semiconductor device 3, portions of the interconnects 34a, 34b, 34c and 34d may be provided in a region, which does not overlap the inductor 16 in a plan view. By doing so, the eddy current generated in the interconnects 34 by the magnetic field of the inductor 16 can be kept small. In addition, from the point of view to achieve the effect efficiently, it is preferable select interconnects closer to the inductor 16 in priority as interconnects, which are not located under the inductor 16.

Figure 9B:
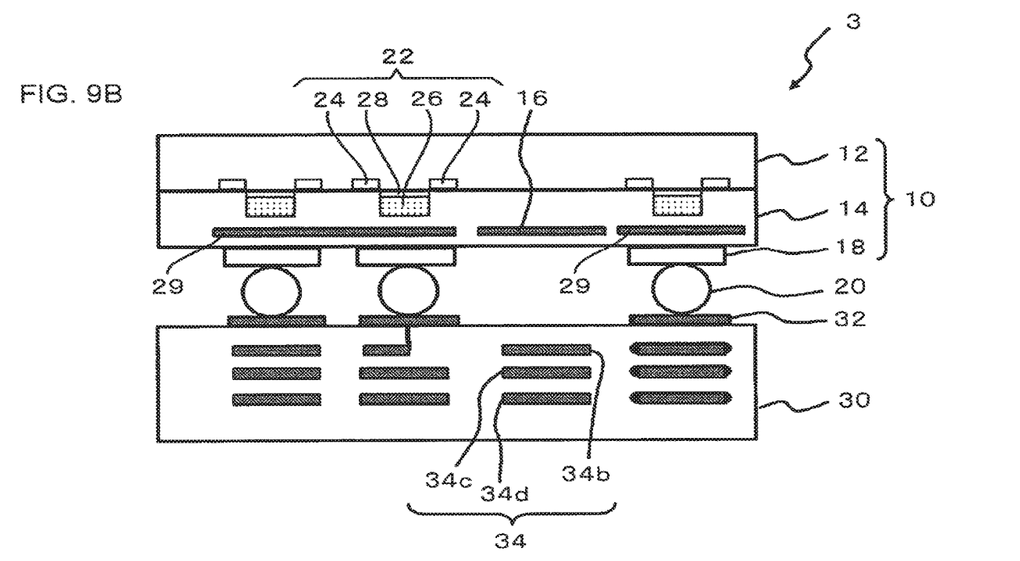
Figure 10A:
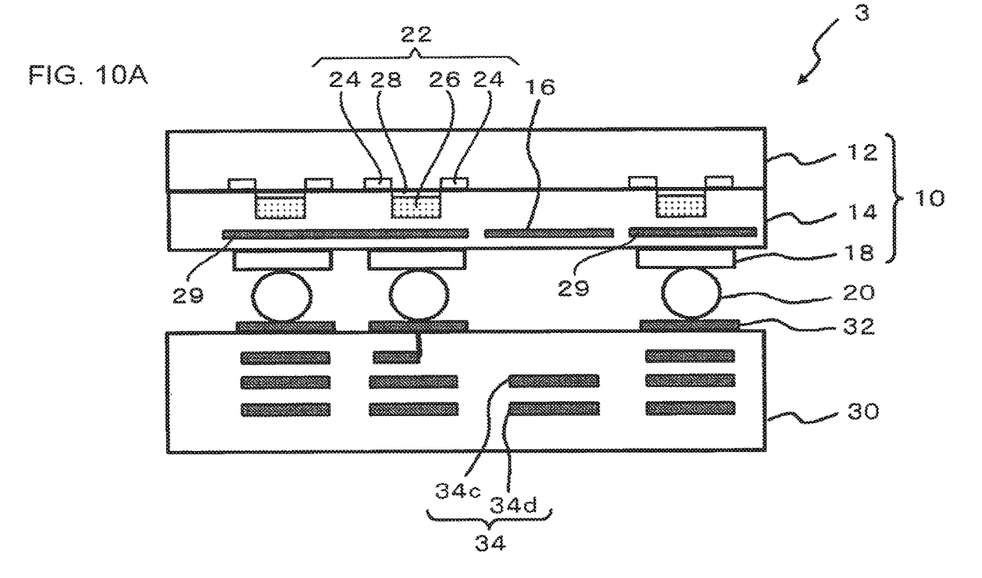
FIGS. 10A and 10B are cross sectional views showing semiconductor devices according to the third embodiment of the present invention.
Figure 10B:
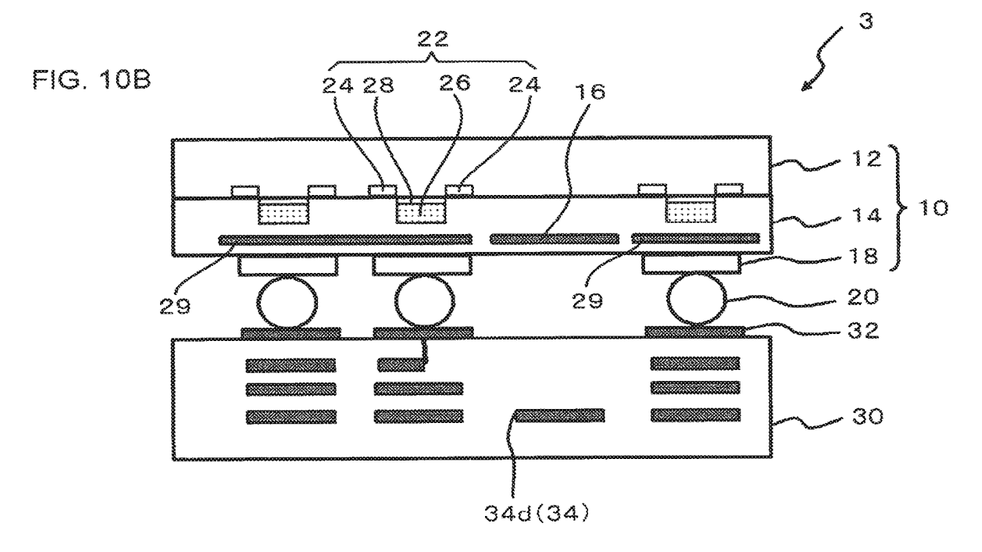

Accordingly, in the case where either among the interconnects 34a, 34h, 34c and 34d are selected as interconnects, which are not located under the inductor 16, it is preferable, select the interconnects 34a as shown in FIG. 9B. In an alternative case where either two among the interconnects 34a, 34b, 34c and 34d are selected as interconnects which are not located under the inductor 16 it is preferable to select the interconnects 34a and 34b, as shown in FIG. 10A. In an alternative case where either three among the interconnects 34a, 34b, 34c and 34d are selected as interconnects which are not located under the inductor 16, it is preferable to select the interconnects 34a, 34b and 34c as shown in FIG. 10B.

The semiconductor device according to the present invention is not limited to those according to the above described embodiments, and various modifications are possible. For example, various arrangements are possible for the pads 18, in addition to the example shown in FIG. 1, as long as the pads 18 are provided in a region, which does not overlap the inductor 16 within the circuit forming region D1.

Figure 4A:
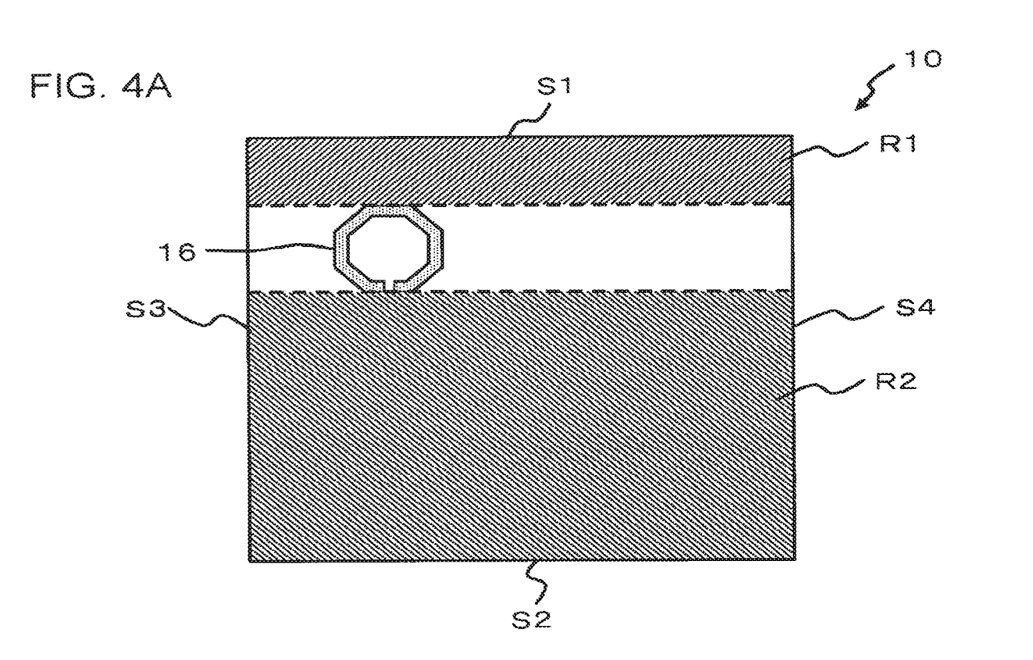
FIGS. 4A and 4B are plan views for illustrating definitions of first to fourth regions.
Figure 4B:
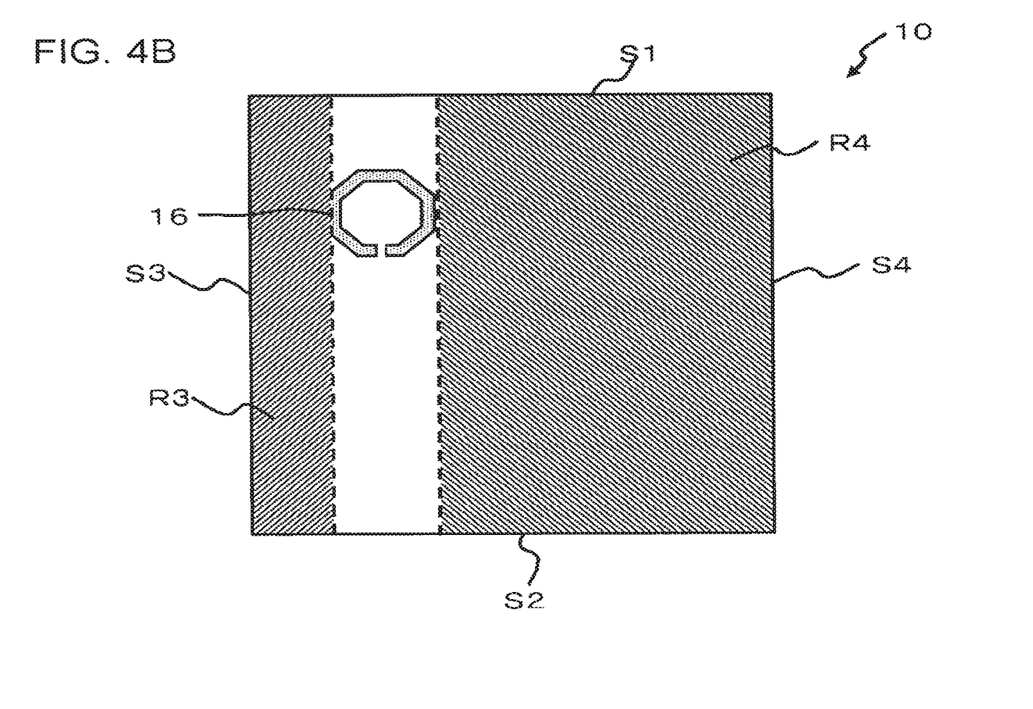

Here, from the point of view of securing sufficient pad resource, it is preferable for the pads 18 to be provided in a plurality of lines in at least either one region among the first, second, third and fourth regions defined as follows. In order to define these regions, as shown in FIGS. 4A and 4B, one pair of facing side surfaces among the four side surfaces of the semiconductor chip 10 are referred to as first side surface S1 and second side surface S2, and the other pair of facing side surfaces are referred to as third side surface S3 and fourth side surface 54. At this time, regions which are closer to the first side surface S1, the second side surface S2, the third side surface S3 and the fourth side surface 54 than the inductor 16 are a first region R1, a second region R2, a third region R3 and a fourth region R4, respectively. Though for the sake of convenience, FIG. 4A shows the regions R1 and R2 and FIG. 4B shows the regions R3 and R4, these FIGS. 4A and 4B show the same semiconductor chip 10.

Figure 5:
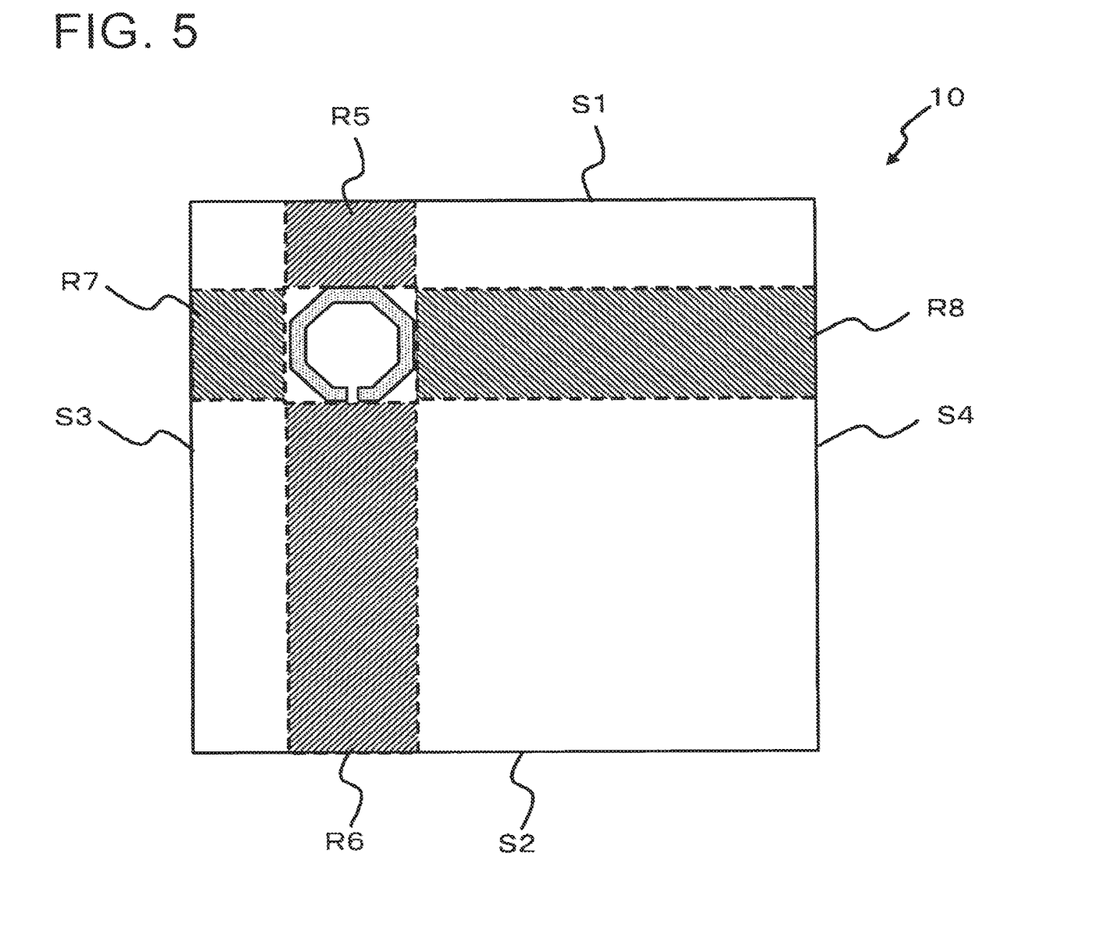
FIG. 5 is a plan view for illustrating definitions of fifth to eighth regions.

Furthermore, as shown in FIG. 5, the regions obtained by extending the region of the inductor 16 to the side surface S1 and the side surface S2 in the direction perpendicular to the side surface S1 (up-down direction in the figure) are defined as fifth region R5 and sixth region R6, respectively, and the regions obtained by extending the region of the inductor 16 to the side surface S3 and the side surface 54 in the direction perpendicular to the side surface (right-left direction in the figure) are defined as seventh region R7 and eighth region R8, respectively. Here, the region originally containing the inductor 16 is not included in any of regions R5, R6, R7 and R8.

From the point of view of securing sufficient pad resource in the regions R5, R6, R7 and R8, which are defined in this manner, it is preferable for pads 18 to be provided in at least one of regions R5 and R6, and for pads 18 to be provided in at least one of regions R7 and R8.

In the following, the above described FIGS. 1 and 7 are compared using the concept of regions R1 to R8 introduced here. FIG. 1 satisfies the condition that "pads are provided in a plurality of lines in at least one of regions R1 to R4." This is because pads 18 are provided in a plurality of lines in the two regions: regions R2 and R4. Meanwhile, in FIG. 7, pads 102 are not provided in a plurality of lines in any of regions R1 to R4, and therefore, this condition is not met.

In addition, in FIG. 1, the condition that "pads are provided in at least one of regions R5 and R6, and at the same time, pads must be provided in at least one of region R7 and R8" is met. This is because pads 18 are provided in the four regions: regions R5, R6, R7 and R8. Meanwhile, in FIG. 7, pads 102 are not provided in either of regions R7 and R8, and therefore, this condition is not met.

Here, in FIGS. 1 and 7, regions on the upper side, lower side, left side and right side of the inductor 16 are respectively defined as regions R1, R2, R3 and R4, as in FIGS. 4A and 4B.

Figure 6A:
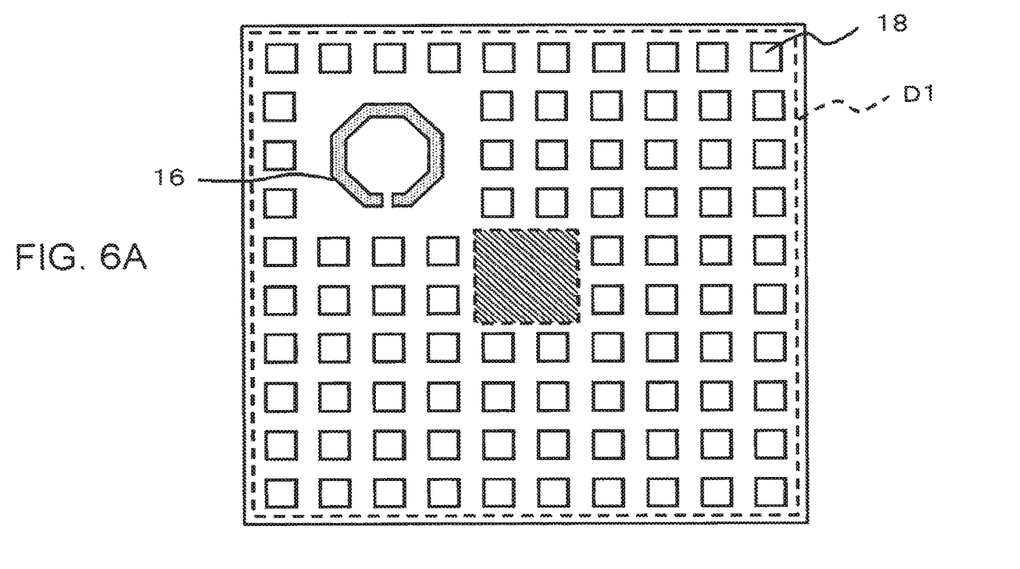
FIGS. 6A and 6B are plan views for illustrating modifications of the embodiments.
Figure 6B:
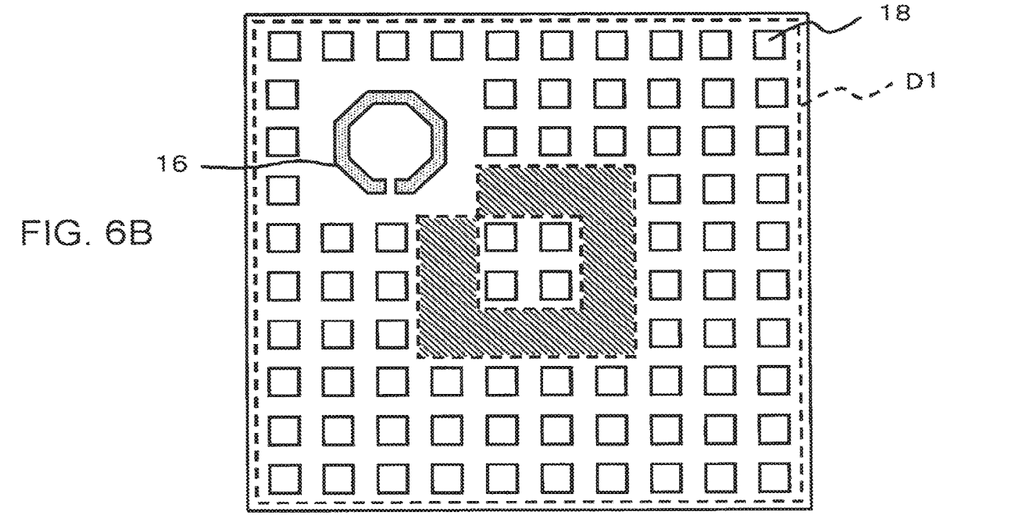

In addition, FIG. 1 shows an example where pads 18 are aligned over almost the entirety of the circuit forming region D1 excluding the region, which overlaps the inductor 16 in a plan view. As shown in FIGS. 6A and 6B, however, there may be a portion where no pads 18 are aligned (hatched portion) in the region within the circuit forming region D1, which does not overlap the inductor 16. The arrangement of the pads 18 in FIG. 6A corresponds to an arrangement obtained by removing the four pads 18, located at the center, from the arrangement obtained by removing four pads 18 in FIG. 1. In addition, the arrangement of the pads 18 in FIG. 68 corresponds to an arrangement obtained by removing eleven pads 18, provided along the periphery of the four pads 18 located at the center, from the arrangement in FIG. 1.

In addition, though examples where all of the pads 18 are provided within the circuit forming region D1 are shown according to the above described embodiments, some parts 18 may be provided outside the circuit forming region D1.

It is apparent that the present invention is not limited to the above embodiment, but may be modified and changed without departing from the scope and spirit of the invention.

The invention claimed is:

1. A semiconductor device, comprising:
    a semiconductor substrate;
    MOS transistors provided on a main surface of the semiconductor substrate;
    an interconnect layer including at least one inductor and at least one interconnect, and provided on the main surface of the semiconductor substrate such that the MOS transistors are covered with the interconnect layer, the at least one inductor and the at least one interconnect being located at a same layer as each other, the interconnect layer having an upper surface that is parallel to the main surface of the semiconductor substrate; and
    conductive pads provided on the upper surface of the interconnect layer that is exposed, the conductive pads being mechanically connectable with bumps, respectively, at an exposed upper surface of each of the conductive pads,
    wherein the conductive pads are provided in a region of the upper surface of the interconnect layer, which does not overlap with the at least one inductor, and which is located above the at least one interconnect,
    wherein there are no conductive pads above the at least one inductor,
    wherein the MOS transistors are provided in a region of the main surface of the semiconductor substrate, which does not overlap with the at least one inductor, and wherein there are no MOS transistors below the at least one inductor.

2. The semiconductor device according to claim 1, wherein the conductive pads are provided in a plurality of lines.

3. The semiconductor device according to claim 1, wherein the conductive pads are regularly arranged in plan view, except a region, which overlaps the at least one inductor.

4. The semiconductor device according to claim 1,
wherein the bumps are provided on the conductive pads, respectively, and
wherein the bumps are provided in a region, which does not overlap with the at least one inductor.

5. The semiconductor device according to claim 1, wherein the at least one inductor is made of an interconnect included in the interconnect layer, the at least one inductor being formed in coil shape.

6. The semiconductor device according to claim 1, wherein the at least one interconnect included in the interconnect layer is provided in a region, which does not overlap with the at least one inductor.

7. The semiconductor device according to claim 1, wherein a distance between the at least one inductor and the main surface of the semiconductor substrate, on which the MOS transistors are provided, is greater than a distance between the at least one inductor and the upper surface of the interconnect layer, on which the first conductive pads are provided, in a thickness direction of the interconnect layer.

8. The semiconductor device according to claim 7, wherein the at least one interconnect of the interconnect layer is provided in a region not overlapping with the at least one inductor.

9. The semiconductor device according to claim 8,
wherein the conductive pads are arranged in a first pitch,
wherein the at least one inductor includes a first inductor,
wherein the conductive pads provided on the upper surface of the interconnect layer include a first conductive pad and a second conductive pad,
wherein the first inductor is located between the first conductive pad and the second conductive pad in plan view, and
wherein a distance between the first conductive pad and the second conductive pad is greater than the first pitch of the conductive pads.

10. The semiconductor device according to claim 1,
wherein the conductive pads are arranged in a first pitch,
wherein the at least one inductor has a first inductor,
wherein the conductive pads have a first conductive pad and a second conductive pad,
wherein the first inductor is located between the first conductive pad and the second conductive pad in plan view, and
wherein a distance between the first conductive pad and the second conductive pad is greater than the first pitch of the conductive pads.

11. The semiconductor device according to claim 1, wherein one of the MOS transistors is overlapped with one of said conductive pads.

12. The semiconductor device according to claim 1,
wherein the at least one interconnect has a first interconnect, and
wherein the at least one inductor and the first interconnect are formed in the same layer.

13. The semiconductor device according to claim 1, wherein the conductive pads are exposed toward outside.

14. The semiconductor device according to claim 1, wherein the conductive pads are exposed from the interconnect layer.

15. The semiconductor device according to claim 1, wherein the conductive pads are formed in the same layer with each other.

16. The semiconductor device according to claim 1, wherein the interconnect layer is provided directly on the main surface of the semiconductor substrate.

17. The semiconductor device according to claim 1, wherein the MOS transistors and the at least one interconnect are disposed directly under the conductive pads.

18. The semiconductor device according to claim 1, wherein the conductive pads are located above and spaced apart from the at least one interconnect.

19. A semiconductor device, comprising:
a semiconductor substrate;
a MOS transistor provided on a main surface of the semiconductor substrate;
an interconnect layer including at least one inductor and at least one interconnect, the interconnect layer being provided on the main surface of the semiconductor substrate such that the MOS transistor is covered with the interconnect layer, the at least one inductor and the at least one interconnect being located at a same layer as each other, the interconnect layer having an upper surface that is parallel to the main surface of the semiconductor substrate; and
a conductive pad provided on the upper surface of the interconnect layer and located above the at least one interconnect, that is exposed, the conductive pad being mechanically connectable with a bump at the exposed upper surface of the conductive pad,
wherein the conductive pad is provided in a region of the upper surface of the interconnect layer, which does not overlap with the at least one inductor, and which is located above the at least one interconnect,
wherein there is no conductive pad above the at least one inductor,
wherein the MOS transistor is provided in a region of the main surface of the semiconductor substrate, which does not overlap with the at least one inductor, and
wherein there is no MOS transistor provided below the at least one inductor.

20. The semiconductor device according to claim 19,
wherein the bump is provided on the conductive pad, and
wherein the bump is provided in a region, which does not overlap with the at least one inductor.

21. The semiconductor device according to claim 20, wherein the MOS transistor is overlapped with the conductive pad.

22. The semiconductor device according to claim 20, wherein the conductive pad is exposed toward outside.

23. The semiconductor device according to claim 20, wherein the conductive pad is exposed from the interconnect layer.

24. The semiconductor device according to claim 19, wherein the conductive pad is spaced apart from the at least one interconnect.

* * * * *